United States Patent
Cheng et al.

(10) Patent No.: US 7,605,663 B2
(45) Date of Patent: Oct. 20, 2009

(54) METHOD AND APPARATUS FOR STABILIZING OUTPUT FREQUENCY OF PLL (PHASE LOCK LOOP) AND PHASE LOCK LOOP THEREOF

(75) Inventors: Chiu-Hung Cheng, Hsinchu (TW); Chih-Jen Yen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 283 days.

(21) Appl. No.: 11/163,122

(22) Filed: Oct. 5, 2005

(65) Prior Publication Data
US 2007/0018734 A1    Jan. 25, 2007

(30) Foreign Application Priority Data
Jul. 21, 2005    (TW) ............... 94124662 A

(51) Int. Cl.
*H03L 7/08*    (2006.01)
(52) U.S. Cl. .............. 331/16; 331/17; 327/157; 327/536; 375/374
(58) Field of Classification Search ............ 331/16, 331/17; 327/156, 157, 536; 375/374–376
See application file for complete search history.

(56) References Cited
U.S. PATENT DOCUMENTS

| | | | | |
|---|---|---|---|---|
| 5,272,453 A * | 12/1993 | Traynor et al. | ............ | 331/57 |
| 6,097,227 A * | 8/2000 | Hayashi | ............ | 327/158 |
| 6,124,741 A * | 9/2000 | Arcus | ............ | 327/112 |
| 6,278,304 B1 * | 8/2001 | Livezey | ............ | 327/157 |
| 6,614,316 B2 * | 9/2003 | Masenas et al. | ............ | 331/17 |
| 6,624,675 B2 * | 9/2003 | Neron | ............ | 327/157 |
| 6,794,946 B2 * | 9/2004 | Farjad-Rad | ............ | 331/16 |
| 6,897,690 B2 * | 5/2005 | Keaveney et al. | ............ | 327/148 |
| 6,914,465 B2 * | 7/2005 | Kiyose et al. | ............ | 327/156 |
| 7,151,413 B2 * | 12/2006 | Lin | ............ | 331/11 |

* cited by examiner

*Primary Examiner*—Benny Lee
*Assistant Examiner*—Levi Gannon
(74) *Attorney, Agent, or Firm*—Jianq Chyun IP Office

(57) ABSTRACT

A method and an apparatus for stabilizing output from a Phase Lock Loop (PLL) and the PLL thereof is disclosed. The method mainly relates to enabling the control voltage of a voltage control oscillator VCO in the PLL remained unchanged by means of turning off a charge-discharge current source of a charge pump in a PLL in response to a detected reference signal lower than a default value. Furthermore, the method enables the pulse frequency output from the VCO no exceeding a default tolerant frequency range in a distance from a desired output frequency. Thus, when the reference signal resumes the original frequency, the PLL can quickly lock the phase and the frequency again.

12 Claims, 5 Drawing Sheets

600
METHOD AND APPARATUS FOR STABILIZING OUTPUT FREQUENCY OF PLL (PHASE LOCK LOOP) AND PHASE LOCK LOOP THEREOF

CROSS-REFERENCE TO RELATED APPLICATION

This application claims the priority benefit of Taiwan application serial no. 94124662, filed on Jul. 21, 2005. All disclosure of the Taiwan application is incorporated herein by reference.

BACKGROUND OF THE INVENTION

1. Field of Invention

The present invention relates to a structure of a Phase Lock Loop (PLL) and a Phase Lock (PL) method, particularly a method for stabilizing output frequency of PLL and an apparatus thereof.

2. Description of the Related Art

That the development of phase lock loops, has been taken a long time and remains an important issue in the electrical field nowadays because the phase lock loops are widely used with prospects for sustainable development. Many features of the phase lock loop on its merits can be continuously improved, advanced, such as: higher frequency upper limit, better stability, larger range of bandwidth and shorter locking-time.

All in all, a PLL essentially uses an oscillating source with negligible frequency-variation as the reference and drives variable frequency components by means of a feedback of a closed loop control system, so that the different frequency components can be synchronized with the oscillating source in a fast and durably stable manner, i.e., is phased being locked.

FIG. 1 is a circuit block diagram of a conventional PLL, where the configuration of a PLL is comprised of five electronic sub-systems: a phase/frequency detector PFD, a charge pump CP, a loop filter LF, a voltage control oscillator VCO and a frequency divider FD. The phase/frequency detector PFD is used for detecting the difference phase between a reference signal REF and a feedback signal DS after dividing frequency and for converting the comparison result into two digital signals, i.e. a pull-up signal DH and a pull-down signal DL, for output. The charge pump CP is for converting the two digital signals into a control voltage CV for output. The loop filter LF is used for filtering out the high-frequency composition from the control voltage. The voltage control oscillator VCO is used for converting the control voltage into an oscillating signal VO for output. The frequency divider FD serves for reducing the frequency and feedbacking the frequency-reduced signal to the phase/frequency detector PFD for comparison with the reference signal REF.

During no reference signal REF available, the Phase/Frequency Detector PFD detects such reference signals, and the pull-up signal DH and the pull-down signal DL outputs logi-0 and logic-1, respectively. When the charge pump CP receives logic-O of the pull-up signal DH and logic-1 of the pull-down signal DL, the control voltage CV is enabled to drop continually. As a result, the frequency of the oscillating signal VO output from the voltage control oscillator VCO is accordingly dropped. As the reference signal REF resumes the original level, the charge pump CP resumes the original value of the control voltage CV. Thus, the frequency of the oscillating signal VO output from the voltage control oscillator VCO resumes as well.

In the event of an intermittent signal, such as: a color synchronic signal (burst signal) or conducting an operation of restoring data, the control voltage CV of a conventional PLL varies frequently and the charge pump CP to charge-discharge the capacitor of the loop filter LF frequently. Thus, changes in the output frequency increase with more power consumption.

SUMMARY OF THE INVENTION

An objective of the present invention is to provide a PLL for producing an output signal with a default frequency as the frequency of the reference signal is lower than the default value.

Another objective of the present invention is to provide an apparatus for stabilizing the output of a PLL, which is able to quickly lock phase as the frequency of the reference signal restores back to a desired frequency.

Further an objective of the present invention is to provide a method for stabilizing the output of a PLL to decrease the frequency for a charge pump to charge-discharge a capacitor and to decrease power consumption.

The present invention provides a PLL, which includes a phase frequency detector, a device for stabilizing the output of the PLL, a charge pump, a voltage control oscillator VCO and a frequency divider FD wherein the charge pump includes a pull-up circuit and a pull-down circuit. The phase/frequency detector PFD is used for receiving a feedback signal and a reference signal and outputting a pull-up signal and a pull-down signal after comparing the feedback signal to the reference signal. The device for stabilizing the output of the PLL is used for receiving the reference signal and outputting a frequency control signal as the frequency of the reference signal is lower than or equal to a default value. The charge pump receives the pull-up and pull-down signals and the frequency control signal and adjusting the output voltage signal according to the pull-up and pull-down signals and the frequency control signal. The pull-up circuit is used for increasing the voltage signal while the pull-down circuit is used for decreasing the voltage signal. The voltage control oscillator VCO receives the voltage signal and outputs an oscillating signal according to the voltage signal. The frequency divider is used for frequency-dividing the oscillating signal to be taken as a feedback signal for output.

The present invention provides a device for stabilizing the PLL output, wherein the PLL includes a charge pump and a voltage control oscillator VCO. The charge pump includes a pull-up circuit and a pull-down circuit. The charge pump is used for the pull-up circuit and the pull-down circuit to block charging-discharging the output voltage as well as outputting a voltage to control the oscillating signal output from the VCO. The device for stabilizing the PLL output includes an edge detector, a first current source, second current source, a charge storing component and a comparator. The edge detector includes the input and output ends, respectively. The input end of the edge detector receives the reference signal. As the frequency of the reference signal is lower than or equal to a default value, the output end of the edge detector outputs a first logic status. When the frequency of the reference signal is higher than a default value, the output end of the edge detector outputs a second logic status. The first current source includes a first end, a second end and a control end. The control end of the first current source is coupled to the output end of the edge detector, the first end of the third current source is coupled to a first level. The second current source includes a first end, a second end and a control end. The control end of the second current source is coupled to the output end of the edge detector, the first end and the second end thereof are coupled to the second end of the first current source and a second level, respectively. An end of the charge storing component is coupled to the second end of the first current source while another end thereof is coupled to the second level. The comparator includes the input end and output ends, respectively. The input end of the comparator is coupled to the second end of the first current source while the output end thereof is coupled to the pull-up circuit and the pull-down circuit. As the voltage of an end of the charge storing component is higher than a default value, the output end of the comparator controls the pull-up circuit and the pull-down circuit to block charging-discharging the output voltage.

The present invention provides a method for stabilizing a PLL output wherein the PLL includes a charge pump and a voltage control oscillator VCO. The charge pump includes a pull-up circuit and a pull-down circuit. The pull-up circuit and the pull-down circuit are used for changing an output voltage to control the oscillating signal output from the VCO. The method includes: receiving a reference signal; controlling the pull-up circuit and the pull-down circuit to block charging-discharging the output voltage. When the frequency of the reference signal is lower than or equal to a default value; outputting an oscillating signal from the VCO according to the output voltage.

According to the present invention, as a reference signal frequency lower than the default value is detected, the charge-discharge current source of the charge pump in the PLL is turned off to prevent the VCO control voltage of the PLL from varying and further to enable the output pulse frequency of the VCO not higher than a default tolerance range at a distance from the desired frequency. In this way, as the reference signal resumes its original frequency, the PLL can quickly lock the phase and the frequency.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

Figure 1:
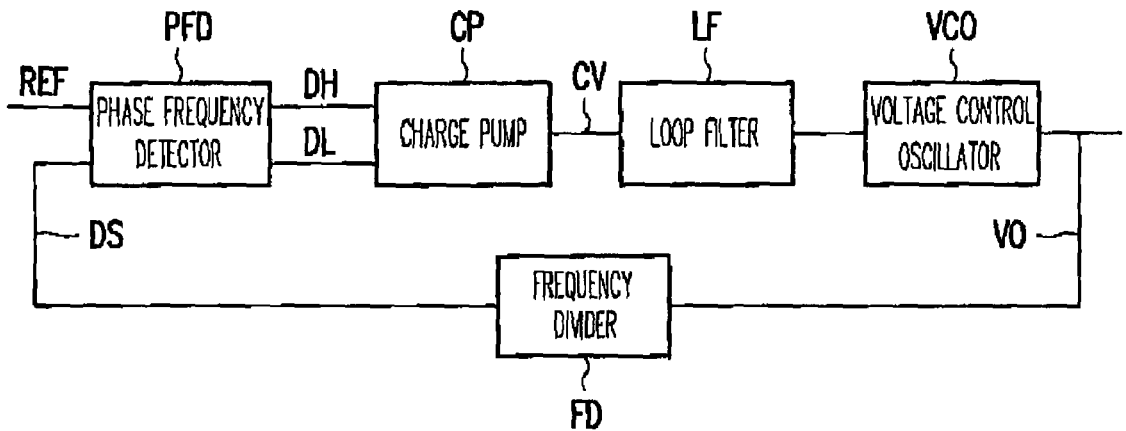
FIG. 1 is a circuit block diagram of a conventional PLL.
Figure 2:
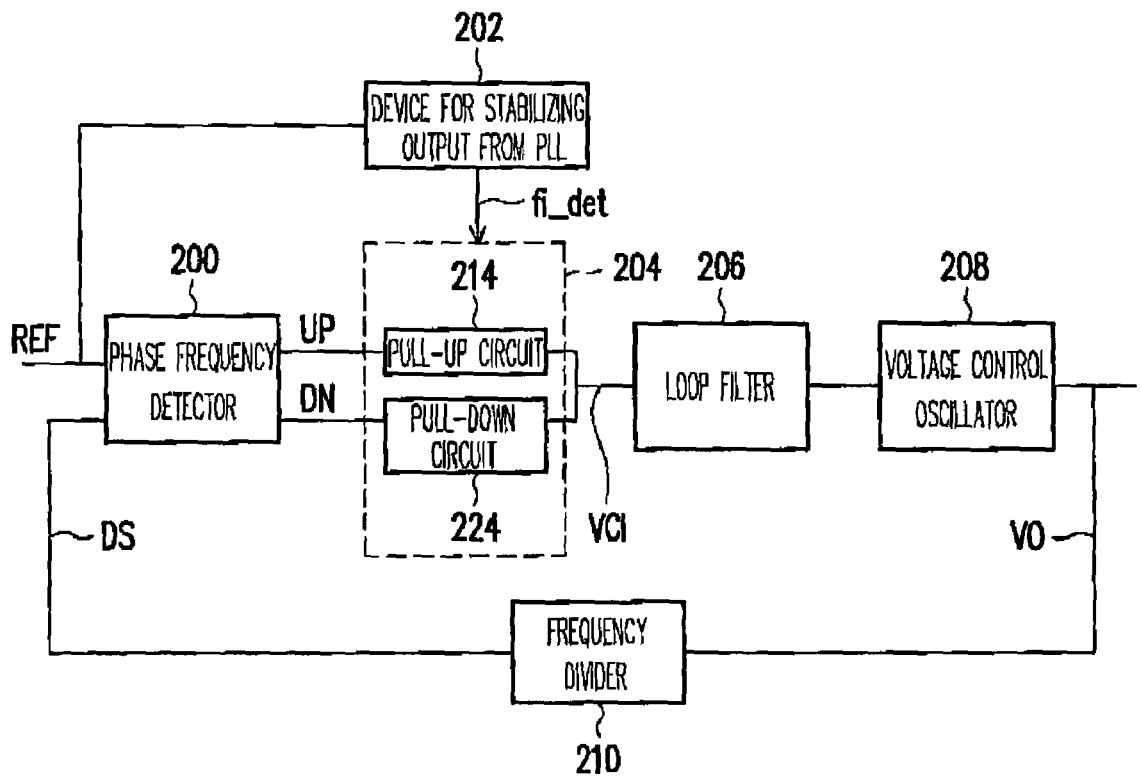
FIG. 2 is a circuit block diagram of a PLL in an embodiment of the present invention.

FIG. 2 is a circuit block diagram of a PLL in an embodiment of the present invention. Referred to FIG. 2, the PLL includes a phase frequency detector 200, a device for stabilizing the PLL output 202, a charge pump 204, a loop filter 206, a voltage control oscillator VCO 208 and a frequency divider 210 wherein the charge pump includes a pull-up circuit 214 and a pull-down circuit 224.

The phase frequency detector 200 receives a feedback signal DS output from the frequency divider 210 and a reference signal REF, compares the feedback signal DS and the reference signal REF and outputs a phase-difference signal. The phase-difference signal mainly includes a pull-up signal UP and a pull-down signal DN. The pull-up signal UP and the pull-down signal DN control the pull-up circuit 214 and the pull-down circuit 224, respectively, for controlling a voltage signal VCI output from the charge pump 204 wherein as the phase of the reference signal REF is higher than the frequency-dividing signal, the pull-up signal outputs a logic-1 signal and the voltage signal VCI is pulled-up. While as the phase of the reference signal REF is lower than the frequency-dividing signal, the pull-down signal outputs a logic-1 signal and the voltage signal VCI is pulled-down.

The loop filter 206 filters the high-frequency composition from the signal VCI, and the filtered signal is sent to the VCO 208. According to the magnitude of the voltage signal VCI, the VCO 208 determines the oscillating frequency of the oscillating signal VO output therefrom. As the voltage signal VCI arises, the oscillating frequency of the oscillating signal VO is increased accordingly. While as the voltage signal VCI drops, the oscillating frequency of the oscillating signal VO is decreased accordingly. The oscillating signal VO is input into the frequency divider 210 where the oscillating signal VO is frequency-divided and then a frequency-dividing signal DS is output to the phase frequency detector 200, and an operation cycle of the closed loop is completed.

A different aspect of the embodiment from the conventional art lies in a device for stabilizing output from PLL 202 is added in the embodiment. Similar to the phase frequency detector 200, the device 202 receives the reference signal REF as well. However, the device 202 is used for determining the frequency of the reference signal REF. As the frequency of the reference signal REF is lower than a default value, for instance, disappearance of the reference signal, the device for stabilizing output from PLL 202 outputs a frequency control signal "fi_det" to control the charge pump 204 for turning-off the pull-up circuit 214 and the pull-down circuit 224. Thus, the pull-up circuit 214 and the pull-down circuit 224 charging-discharging the voltage signal VCI. In this way, in the event of intermittent reference signal REF, for instance, a color synchronic signal, or a burst signal, the Charge Pump CP of the PLL does not require frequently charge-discharge the capacitor of the loop filter. While the reference signal resumes the original frequency thereof, the PLL can quickly lock the phase and the frequency.

Figure 3A:
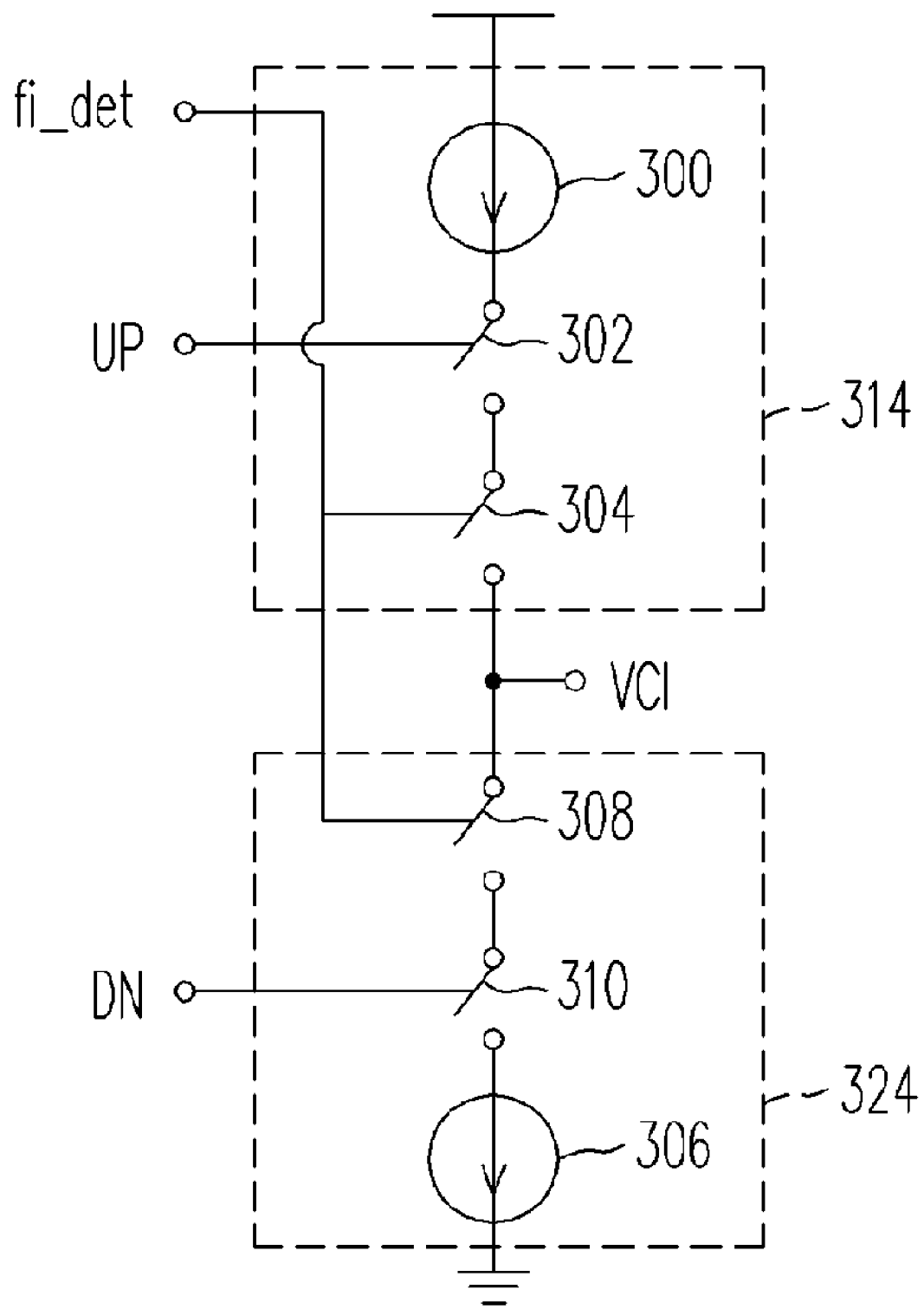
FIG. 3A and FIG. 3B are diagrams detailing the circuits of a charge pump in an embodiment of the present invention.
Figure 3B:
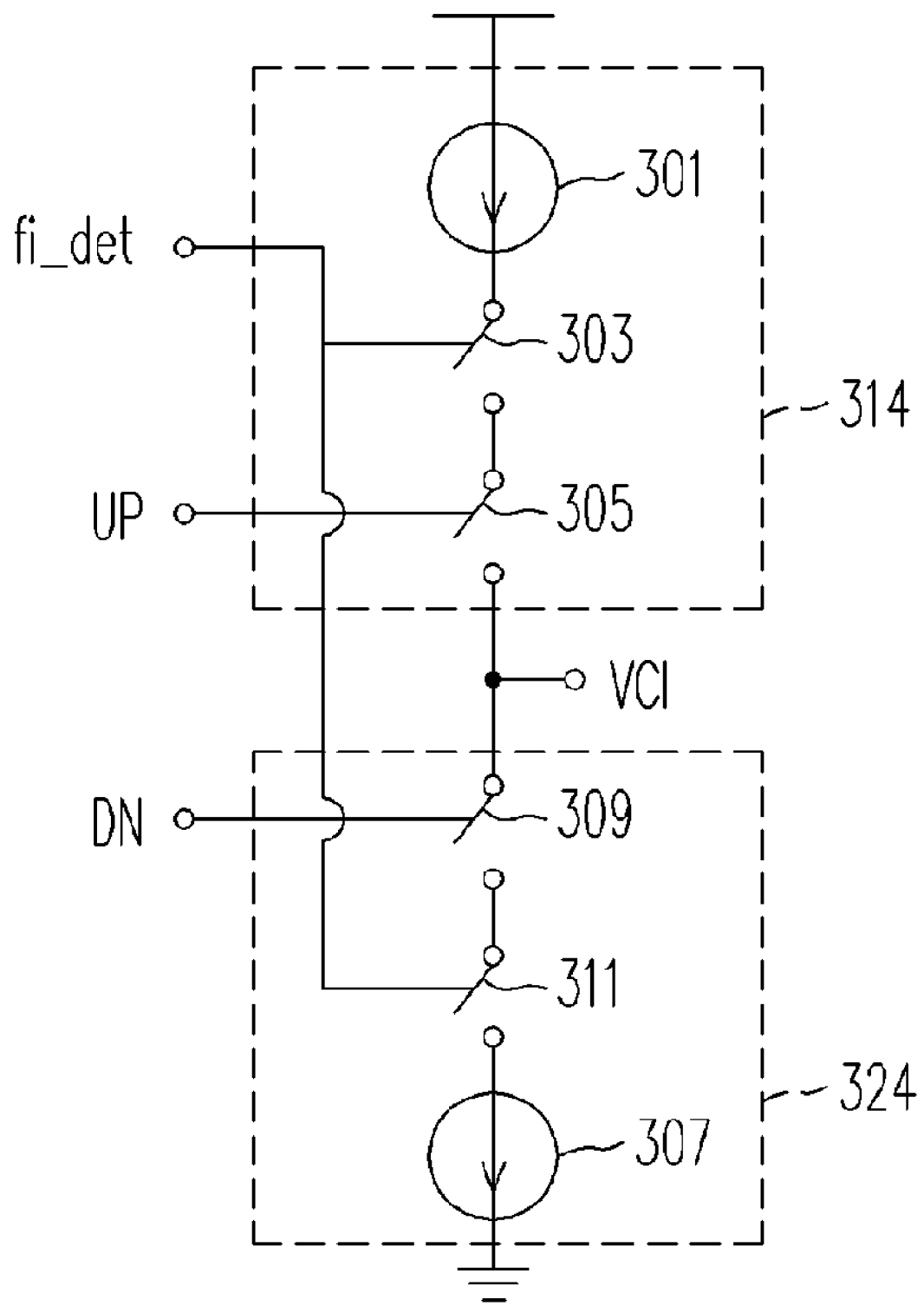

FIG. 3A and FIG. 3B are diagrams detailing the circuits of a charge pump 204 in an embodiment of the present invention. Referred to FIG. 3A, the pull-up circuit 314 and the pull-down circuit 324 marked with a dotted line frame are the same as that of the pull-up circuit 214 and the pull-down circuit 224 in FIG. 2. The pull-up circuit 314 includes a current source 300, switches 302 and 304. The pull-down circuit 324 includes a current source 306, switches 308 and 310. In general, the switches 304 and 308 are both in the on state. As the pull-up signal UP is logi-1, the switch 302 is in the on stare and current of the current source 300 is output to pull-up the voltage signal VCI via the switch 304. Similarly, as the pull-down signal DN is logic-1, the switch 310 is in the on state and the current source 306 can output and pull-down the voltage signal VCI via the switch 310. As the switches 304 and 308 receive the frequency control signal "fi_det", the switches 302 and 308 are in the off state to stabilize the voltage signal VCI, so that the voltage signal VCI remains unchanged even if the pull-up signal UP and the pull-down signal DN vary in different states.

Referred to FIG. 3B, the pull-up circuit 314 and the pull-down circuit 324 marked with a dotted line frame are the same as that of the pull-up circuit 214 and the pull-down circuit 224 in FIG. 2. The pull-up circuit 314 includes a current source 301, switches 303 and 305. The pull-down circuit 324 includes a current source 307, switches 309 and 311. The operation in FIG. 3B is the same as that shown in FIG. 3A by simply replacing the switches 302, 304, 308 and 310 in FIG. 3A with the switches 305, 303, 311 and 309 in FIG. 3B, respectively. Therefore, further details are omitted herein.

Figure 4:
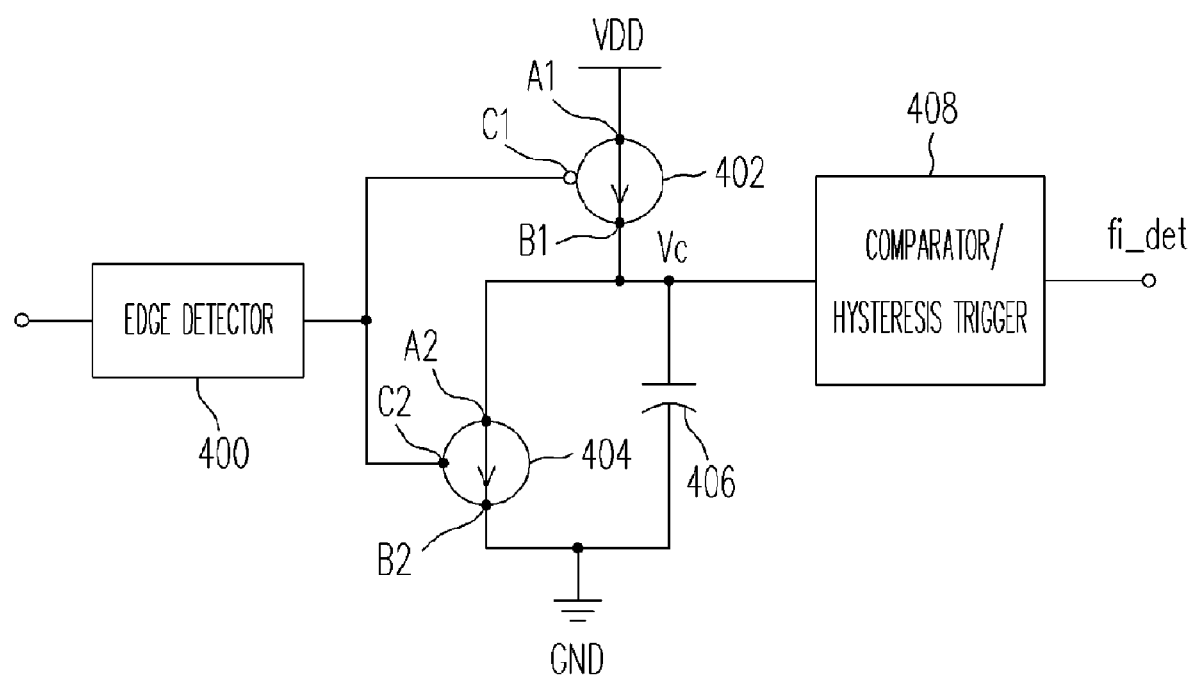
FIG. 4 is a schematic circuit drawing of a device for stabilizing the PLL output.

FIG. 4 is a schematic circuit drawing of a device for stabilizing the PLL output in an embodiment. Referred to FIG. 4, the device for stabilizing output from PLL in the embodiment includes an edge detector 400, current sources 402 and 404, a charge storing component 406 and a comparator/hysteresis trigger 408 wherein the first end A1 of the current source 404 is coupled to a first level. Take the VDD in FIG. 4 for example. The first end A2 of the current source 404 is coupled to the second end B1 of the current source 402 while the second end B2 of the current source 404 is coupled to a second level (for example, the grounding in FIG. 4). The output end of the edge detector 400 is coupled to the control end C1 of the current source 402 and control end C2 of the current source 404. An end of the charge storing component 406 is coupled to the first end A1 of the current source 402, while another end thereof is coupled to the second level, the grounding in FIG. 4 for instance. The input end of the comparator/hysteresis trigger 408 is coupled to the first end A1 of the current source 402.

The edge detector 400 receives the reference signal REF. As detecting the rising or lowering edge of reference signal REF, the edge detector 400 would output a signal to turn on the current source 404 for turning-on and to enable the charge storing component 406 discharged. If the reference signal REF disappears for unknown reasons, the edge detector 400 detect no edges; therefore, the detector 400 can output a signal to turn off the current source 404 and to turn on the current source 402 and to charge the charge storing component 406. When the charge storing component 406 is charged to a default voltage, the comparator/hysteresis trigger 408 outputs a positive saturated-voltage for turning off the switches 304 and 308 in FIG. 3A or the switches 303 and 311 in FIG. 3B. Thus, the voltage signal VCI is remained at a default value, so that the VCO 208 also makes the oscillating signal VO output therefrom remained at a default frequency. For those skilled in the art, such design options is known and details of charging-discharging the charge storing component, coupling the charge storing component to a power supply or to ground and outputting a positive saturated-voltage or a negative saturated-voltage from the comparator/hysteresis trigger 408 are omitted herein.

Figure 5:
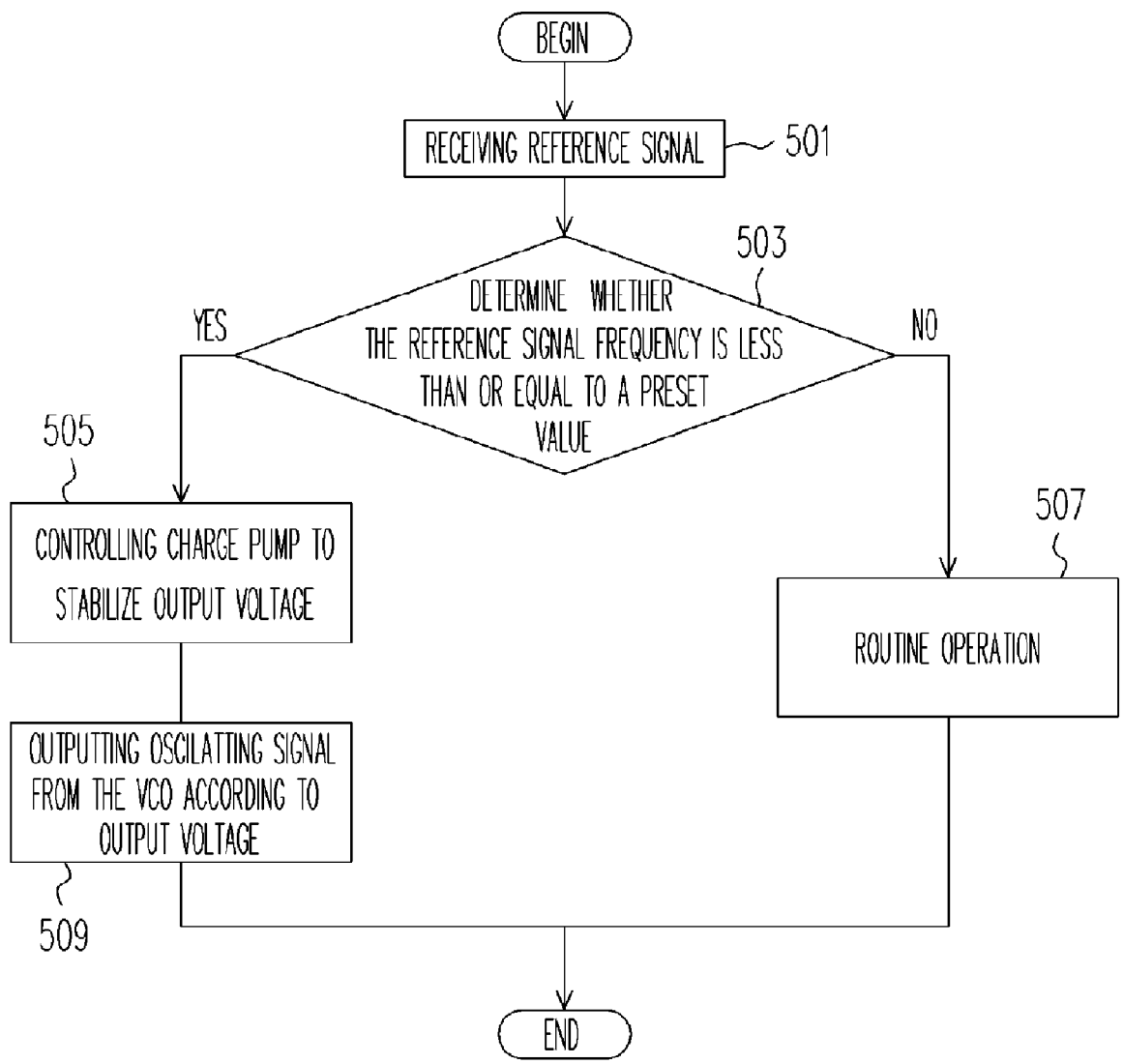
FIG. 5 is a flowchart of the method provided by an embodiment of the present invention.

From the above-described embodiments, a method for stabilizing a PLL output could be generalized. FIG. 5 is a flowchart of the method provided by an embodiment of the present invention. Referred to FIG. 5, first at step 501, a reference signal REF is received. Next, step 503 is for determining whether the frequency of the reference signal REF lower than or equal to a default value and within a default duration or not. If 'yes' is obtained by the determination, procedure goes to step 505 in which the charge pump is controlled for stabilizing the output voltage. If 'no' is obtained by determination, procedure goes to step 507 in which the PLL continues the routine operations. In the end, at step 509, the VCO outputs an oscillating signal VO according to the output voltage VCI.

It can be seen from the above described, according to the present invention, when the frequency of the reference signal lower than a default value is detected, the charge-discharge current source of the charge pump in the PLL is turned off, so that the control voltage of the VCO in the PLL remains unchanged. In this way, the pulse frequency output from the VCO is in a default tolerance range in distance from the desired output frequency. Consequently, as the reference signal resumes the original frequency, the PLL can quickly lock the phase and the frequency.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A Phase Lock Loop (PLL), comprising:
a phase frequency detector, used for receiving a feedback signal and a reference signal and outputting a pull-up signal and a pull-down signal after comparing the feedback signal to the reference signal;
a device for stabilizing the output of the PLL, used for receiving the reference signal and for outputting a frequency control signal in response to the reference signal with a frequency lower than or equal to a default value, wherein the device for stabilizing the output of the PLL comprises:
  a third current source, comprising a first end, a second end, and a control end. wherein the first end of the third current source is coupled to a first level;
  a fourth current source, comprising a first end, a second end, and a control end, wherein the first end of the fourth current source is coupled to the second end of the third current source, and the second end of the fourth current source is coupled to a second level;
  a charge storing component, wherein an end thereof is coupled to the second end of the third current source, and the other end is coupled to the second level;
  an edge detector, comprising an input end and an output end, wherein the input end of the edge detector receives the reference signal, and the output end of the edge detector is coupled to the control end of the third current source and the control end of the fourth current source, wherein when the reference signal transits to a second status from a first status, the fourth current source is turned on; otherwise, the third current source is turned on; and
  a comparator, comprising an input end and an output end, wherein the input end of the comparator is coupled to the second end of the third current source, and the output end of the comparator outputs the frequency control signal;
a charge pump, having an output end for outputting a voltage signal, used for receiving the pull-up signal and the pull-down signal and the frequency control signal and to output the voltage signal according to the pull-up signal, the pull-down signal and the frequency control signal, comprising:
  a pull-up circuit, receiving the pull-up signal and the frequency control signal, coupled to the output end of the charge pump and used for increasing the voltage signal; and
  a pull-down circuit, receiving the pull-down signal and the frequency control signal, coupled to the output end of the charge pump and used for decreasing the voltage signal, wherein the pull-up circuit and the pull-down circuit are turned off by the frequency control signal to stabilize the voltage signal when the frequency of the reference signal is lower than or equal to the default value;

a voltage control oscillator VCO, receiving the voltage signal and used for outputting an oscillating signal according to the voltage signal; and a frequency divider, used for dividing frequency of the oscillating signal and then for outputting the frequency-divided oscillating signal as the feedback signal.

2. The PLL as recited in claim 1, further comprising a loop filter coupled between the charge pump and the VCO used for filtering the high-frequency noise from the voltage signal.

3. The PLL as recited in claim 1, wherein the pull-up circuit comprises:
   a first current source, comprising a first end and a second end, wherein the first end of the first current source is coupled to the first level;
   a first switch, comprising a first end, a second end and a control end, wherein the first end of the first switch is coupled to the second end of the first current source, while the control end of the first switch receives the pull-up signal; and
   a second switch, comprising a first end, a second end and a control end, wherein the first end of the second switch is coupled to the second end of the first switch, the control end of the second switch receives the frequency control signal, and the second end of the second switch is coupled to the output end of the charge pump.

4. The PLL as recited in claim 3, wherein the pull-down circuit comprises:
   a second current source, comprising a first end and a second end, wherein the second end of the second current source is coupled to the second level;
   a third switch, comprising a first end, a second end and a control end, wherein the first end of the third switch is coupled to the first end of the second current source, while the control end of the third switch receives the pull-down signal; and
   a fourth switch, comprising a first end, a second end and a control end, wherein the second end of the fourth switch is coupled to the second end of the third switch, the control end of the fourth switch receives the frequency control signal, and the first end of the fourth switch is coupled to the output end of the charge pump.

5. The PLL as recited in claim 1, wherein the pull-up circuit comprises:
   a first current source, comprising a first end and a second end, wherein the first end of the first current source is coupled to the first level;
   a first switch, comprising a first end, a second end and a control end, wherein the first end of the first switch is coupled to the second end of the first current source, while the control end of the first switch receives the frequency control signal; and
   a second switch, comprising a first end, a second end and a control end, wherein the first end of the second switch is coupled to the second end of the first switch, the control end of the second switch receives the pull-up signal, and the second end of the second switch is coupled to the output end of the charge pump.

6. The PLL as recited in claim 5, wherein the pull-down circuit comprises:
   a second current source, comprising a first end and a second end, wherein the second end of the second current source is coupled to the second level;
   a third switch, comprising a first end, a second end and a control end, wherein the first end of the third switch is coupled to the first end of the second current source, while the control end of the third switch receives the frequency control signal; and a fourth switch, comprising a first end, a second end and a control end, wherein the second end of the fourth switch is coupled to the second end of the third switch, the control end of the fourth switch receives the pull-down signal, and the first end of the fourth switch is coupled to the output end of the charge pump.

7. An apparatus for stabilizing output from PLL, wherein the PLL comprises a charge pump and a voltage control oscillator VCO and the charge pump is used for outputting an output voltage to control an oscillating signal output from the VCO, comprising:
   a first current source, comprising a first end, a second end and a control end, wherein the first end of the first current source is coupled to a first level;
   a second current source, comprising a first end, a second end and a control end, wherein the first end of the second current source is coupled to the second end of the first current source, while the second end of the second current source is coupled to a second level;
   an edge detector, comprising an input end and an output end, wherein the input end thereof receives a reference signal; the output end thereof is coupled to the control end of the first current source and the control end of the second current source; as the reference signal transits to a second status from a first status, the second current source is turned on and otherwise, the first current source is turned on;
   a charge storing component, wherein an end thereof is coupled to the second end of the first current source, while another end is coupled to the second level; and
   a comparator, comprising an input end and an output end, wherein the input end thereof is coupled to the second end of the first current source, while the output end thereof is coupled to the charge pump, and when the voltage of the comparator input end is larger than a default value, the output of the comparator controls the charge pump for stabilizing the output voltage.

8. The apparatus for stabilizing output from PLL as recited in claim 7, wherein the charge pump comprises a pull-up circuit and a pull-down circuit for controlling the magnitude of the output voltage.

9. The apparatus for stabilizing output from PLL as recited in claim 8, wherein the pull-up circuit comprises:
   a third current source, comprising a first end and a second end, wherein the first end of the third current source is coupled to the first level;
   a first switch, comprising a first end, a second end and a control end, wherein the first end of the first switch is coupled to the second end of the third current source; and
   a second switch, comprising a first end, a second end and a control end, wherein the first end of the second switch is coupled to the second end of the first switch, and the control end of the second switch is coupled to the output end of the comparator.

10. The apparatus for stabilizing output from PLL as recited in claim 9, wherein the pull-down circuit comprises:
   a fourth current source, comprising a first end and a second end, wherein the second end of the fourth current source is coupled to the second level;
   a third switch, comprising a first end, a second end and a control end, wherein the first end of the third switch is coupled to the first end of the fourth current source; and
   a fourth switch, comprising a first end, a second end and a control end, wherein the second end of the fourth switch is coupled to the second end of the third switch, the control end of the fourth switch is coupled to the output end of the comparator, while the first end of the fourth switch is coupled to the second end of the second switch.

11. The apparatus for stabilizing output from PLL as recited in claim 8, wherein the pull-up circuit comprises:
- a third current source, comprising a first end and a second end, wherein the first end of the third current source is coupled to the first level;
- a first switch, comprising a first end, a second end and a control end, wherein the first end of the first switch is coupled to the second end of the third current source, the control end of the first switch is coupled to the output end of the comparator; and
- a second switch, comprising a first end, a second end and a control end, wherein the first end of the second switch is coupled to the second end of the first switch.

12. The apparatus for stabilizing output from PLL as recited in claim 11, wherein the pull-down circuit comprises:
- a fourth current source, comprising a first end and a second end, wherein the second end of the fourth current source is coupled to the second level;
- a third switch, comprising a first end, a second end and a control end, wherein the first end of the third switch is coupled to the first end of the fourth current source, and the control end of the third switch is coupled to the output end of the comparator; and
- a fourth switch, comprising a first end, a second end and a control end, wherein the second end of the fourth switch is coupled to the second end of the third switch, while the first end of the fourth switch is coupled to the second end of the second switch.

* * * * *